United States Patent
Yanagihashi et al.

(10) Patent No.: US 10,420,217 B2
(45) Date of Patent: Sep. 17, 2019

(54) CONDUCTOR CONNECTING STRUCTURE

(71) Applicant: Molex, LLC, Lisle, IL (US)

(72) Inventors: Taku Yanagihashi, Yamato (JP);
Shingo Izuchi, Yamato (JP); Takeshi Tsukahara, Yamato (JP)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/675,854

(22) Filed: Aug. 14, 2017

(65) Prior Publication Data
US 2018/0132352 A1 May 10, 2018

(30) Foreign Application Priority Data
Aug. 16, 2016 (JP) ................... 2016-159429

(51) Int. Cl.
*H05K 1/18* (2006.01)
*H05K 1/02* (2006.01)
*H05K 1/11* (2006.01)

(52) U.S. Cl.
CPC ............ *H05K 1/18* (2013.01); *H05K 1/028* (2013.01); *H05K 1/111* (2013.01); *H05K 1/181* (2013.01); *H05K 2201/10356* (2013.01)

(58) Field of Classification Search
CPC .................... H05K 1/18; H05K 1/181
See application file for complete search history.

(56) References Cited

U.S. PATENT DOCUMENTS 5,172,852 A * 12/1992 Bernardoni ............ H05K 1/111
228/180.21
6,575,762 B2 * 6/2003 Evans ................... H01R 9/0515
439/63

FOREIGN PATENT DOCUMENTS

JP    2006-014906 A    1/2006

* cited by examiner

*Primary Examiner* — Jeremy C Norris
(74) *Attorney, Agent, or Firm* — Molex, LLC (57) ABSTRACT

The present disclosure provides a conductor connecting structure that connects a cable to a substrate, where the substrate includes at least one connection pad, the cable includes at least one core wire, the core wire is connected to an upper surface of the connection pad through soldering, and the connection pad includes a solder storing part that is present further frontward than a front end of the core wire.

20 Claims, 5 Drawing Sheets

CONDUCTOR CONNECTING STRUCTURE

RELATED APPLICATIONS

This application claims priority to Japanese Application No. 2016-159429, filed Aug. 16, 2016, which is incorporated herein by reference in its entirety.

TECHNICAL FIELD

The present disclosure relates to a conductor connecting structure.

BACKGROUND ART

Conventionally, a conductor connecting structure is used to electrically connect a cable such as a signal wire or the like to a substrate such as a circuit board or the like. The conductor connecting structure connects core wires of a plurality of electrical wires provided by a cable to a plurality of connection pads formed on a substrate by soldering (for example, refer to Patent Document 1).

Figure 8:
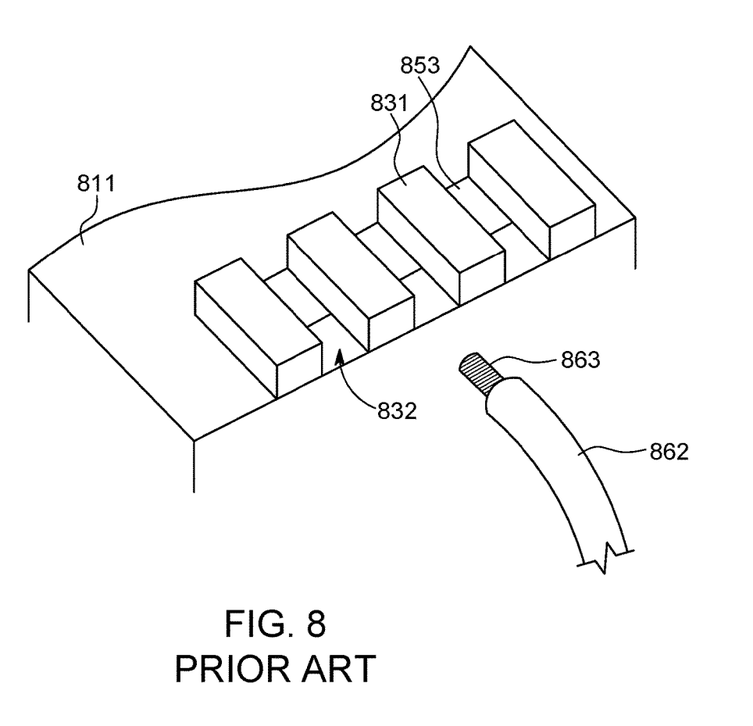
FIG. 8 is a perspective view illustrating a conventional conductor connecting structure.

FIG. 8 is a perspective view illustrating a conventional conductor connecting structure.

In the drawing, 811 represents a circuit board, which provides a plurality of conductive traces not illustrated in the drawing. Furthermore, a connection terminal 853 as a plurality of conductive pads connected to the conductive traces is formed on the circuit board 811. Core wires 863 of a plurality of signal wires 862 provided by a cable not illustrated in the drawing are connected by soldering to the connection terminals 853. Note that the signal wire 862 is in a condition where insulating coating on a portion near a tip end is removed such that the core wire 863 is exposed.

Furthermore, a plurality of protrusions 831 are formed at intervals therebetween on a surface of the circuit board 811 so as to sandwich the connection terminal 853. Furthermore, the electrical wire securing groove 832 is formed between adjacent protrusions 831, and the connection terminal 853 is positioned on a bottom surface of the electrical wire securing groove 832.

When the core wire 863 is connected to the connection terminal 853, a portion where the insulating coating of the signal wire 862 remains is inserted into the electrical wire securing groove 832, and the exposed core wire 863 is positioned on the connection terminal 853. Furthermore, melted solder is provided inside the electrical wire securing groove 832 to connect the core wire 863 and connection terminal 853.

Thereby, the core wires 863 can be connected in a condition accurately positioned with regard to the corresponding connection terminals 853. Furthermore, the solder is maintained inside the electrical wire securing groove 832, and therefore, adjacent core wires 863 or connection terminals 853 do not short circuit due to the solder.

Patent Document 1: Japanese Unexamined Patent Application Publication No. 2006-014906

SUMMARY

However, in a conventional conductor connecting structure, the connection terminal 853 is arranged in the electrical wire securing groove 832 formed between adjacent protrusions 831, and the insulating coating of the signal wire 862 is inserted into the electrical wire securing groove 832, and therefore, the pitch of the connection terminal 853 cannot be reduced. For example, connecting a plurality of fine electrical wires to a substrate provided with a fine connection pad arranged at a narrow pitch is difficult, as with a substrate for an ASIC (Application Specific Integrated Circuit).

Herein, in order to resolve the problem of the conventional conductor connecting structure, an object of the present invention is to provide a connection pad that includes a solder storing part that is present further frontward than a front end of an electrical wire, such that a plurality of fine electrical wires can be reliably connected to a fine connection pad by soldering, which enhances reliability.

Therefore, a conductor connecting structure is a conductor connecting structure that connects a cable to a substrate, where the substrate includes at least one connection pad, the cable includes at least one core wire, the core wire is connected to an upper surface of the connection pad through soldering, and the connection pad includes a solder storing part that is present further frontward than a front end of the core wire.

In another conductor connecting structure, the solder storing part is present across a range two or more times the diameter of the core wire.

In yet another conductor connecting structure, a solder fillet is formed in front of the core wire.

In yet another conductor connecting structure, a plurality of the connection pads are arranged side by side, and a coating film of a solder resist is formed between the connection pads adjacent on an upper surface of the substrate.

In yet another conductor connecting structure, a plurality of the connection pads are arranged side by side, and a coating film of an insulation protective film is formed between the connection pads adjacent on an upper surface of the substrate.

In yet another conductor connecting structure, the connection pad has side ends exposed further upward than an upper surface of the substrate on both left and right sides, and the solder adheres to at least one side end.

In yet another conductor connecting structure, the solder fillet is formed behind the connection pad.

In yet another conductor connecting structure, the substrate is a printed circuit board, flexible circuit board (FPC: Flexible Printed Circuit), or integrated circuit board.

According to the present disclosure, a conductor connecting structure has a connection pad that includes a solder storing part that is present further frontward than a front end of an electrical wire. Thereby, a plurality of fine electrical wires can be reliably connected to a fine connection pad by soldering, which can enhance the reliability of the conductor connecting structure.

BRIEF DESCRIPTION OF THE DRAWINGS

FIGS. 5A and 5B illustrate a main part enlarged front surface view of the conductor connecting structure according to the present embodiment, where FIG. 5A is a view illustrating a case where a positional deviation does not occur, and FIG. 5B is a view illustrating a case where a positional deviation occurs.

FIGS. 6A and 6B illustrate a main part enlarged front surface view of the conductor connecting structure according to the present embodiment, formed by means of preventing a solder bridge from occurring, where FIG. 6A is a view illustrating a case where the solder resist is used, and FIG. 6B is a view illustrating a case where the insulation protective film is used.

DETAILED DESCRIPTION OF THE PREFERRED EMBODIMENTS

The embodiments will be described in detail below with reference to the drawings.

Figure 1:
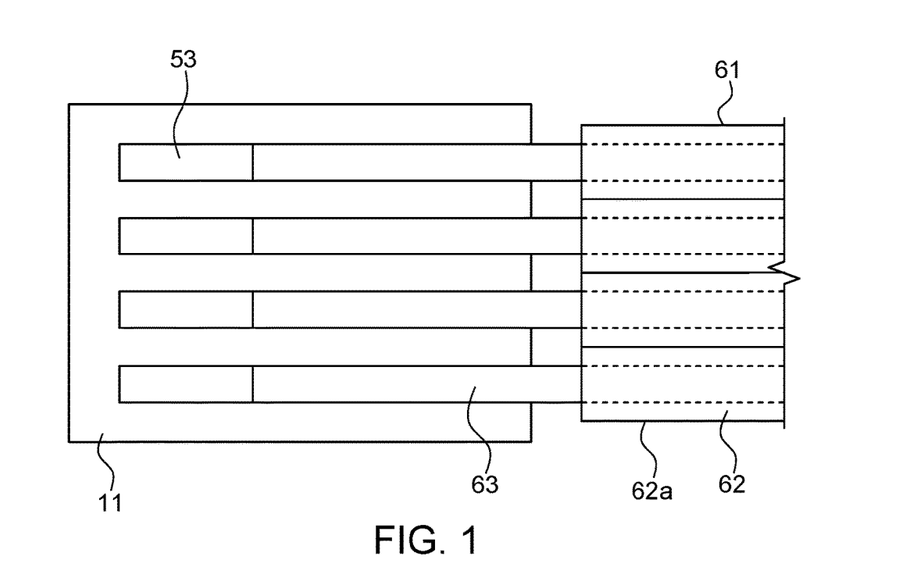
FIG. 1 is a top surface view of the conductor connecting structure according to the present embodiment.
Figure 2:
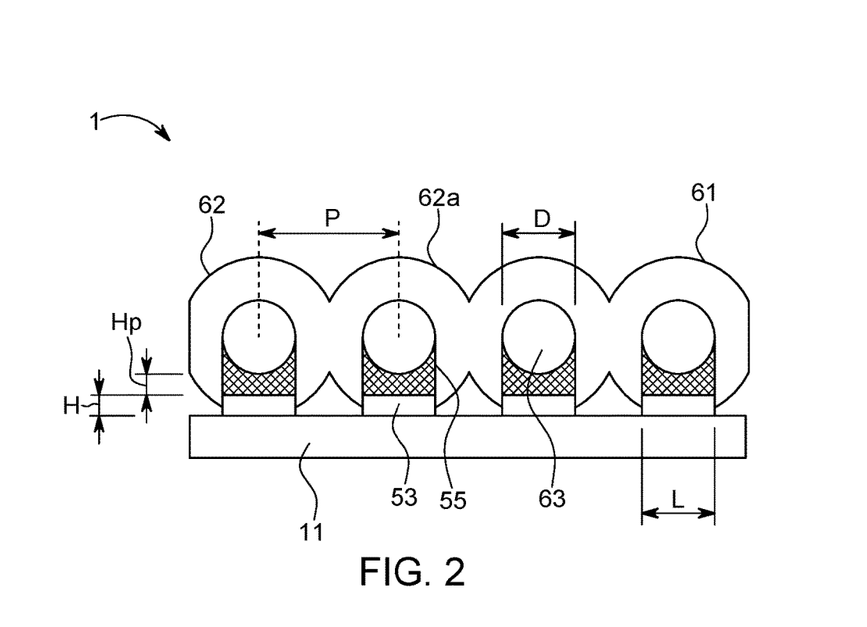
FIG. 2 is a front surface view of the conductor connecting structure according to the present embodiment.
Figure 3:
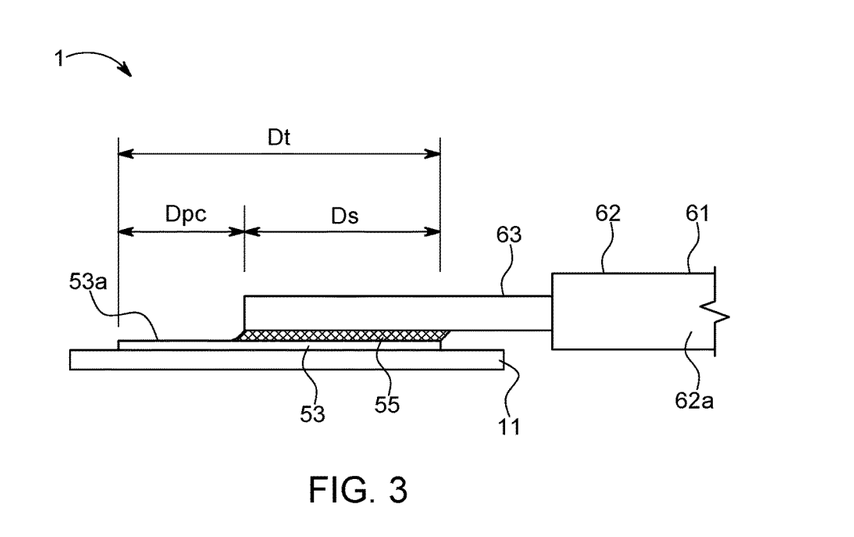
FIG. 3 is a side surface view of the conductor connecting structure according to the present embodiment.
Figure 4:
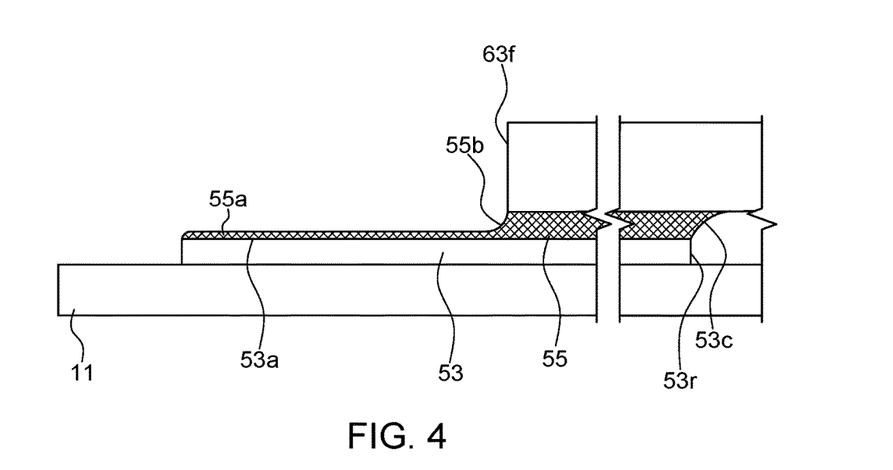
FIG. 4 is a main part enlarged side surface view of the conductor connecting structure according to the present embodiment.

FIG. 1 is an upper surface of the conductor connecting structure according to the present embodiment; FIG. 2 is a front surface of the conductor connecting structure according to the present embodiment; FIG. 3 is a side surface view of the conductor connecting structure according to the present embodiment; and FIG. 4 is a main part enlarged side surface view of the conductor connecting structure according to the present embodiment.

In the drawings, 1 indicates the conductor connecting structure according to the present embodiment, which is a conductor connecting structure that connects a cable 61 to a substrate 11.

In the present embodiment, the substrate 11 itself is a printed circuit board, flexible flat cable (FFC), flexible circuit board, integrated circuit board, or the like to which is mounted an ASIC or other integrated circuit, a resistive element, capacitive element, or other element, a substrate connector, cable connector, or other connector, or other members for example, but may be any type of substrate so long as a conductive trace or conductive wire is included on at least a portion. Note that in the drawings, the substrate 11 is illustrated as a small rectangular plate shaped member for convenience of illustration, but may be a member with any shape or size, or may be a portion of another member.

Furthermore, in the present embodiment, the cable 61 may be a ribbon cable where a plurality of (for example, four) electrical wires 62 are arranged in parallel, and as illustrated in the drawing for example, a portion of the insulating coating 62a of the electrical wires 62 may be integrated to form one ribbon, may be a flexible flat cable, may be a cable where the plurality of electrical wires 62 are bundled and stored in the insulation coating, or may be any type of cable. Note that the number of electrical wires 62 may be one, may be five or more, or may be any number. Furthermore, the electrical wires 62 may be a signal wire that transmits a signal, may be an electrical wire that supplies electrical power, may be a ground wire that function for grounding, or may be any type of wire.

Note that expressions for indicating directions such as up, down, left, right, front, back, and the like, used to describe the operations and configurations of the parts of the conductor connecting structure 1 in the present embodiment are not absolute but rather relative directions, and though appropriate when the parts of the conductor connecting structure 1 are in the postures illustrated in the figures, these directions should be interpreted differently when these postures change, to correspond to said change.

In a portion near a front end (left end in FIGS. 1 and 3) of the electrical wires 62 of the cable 61, the insulating coating 62a is removed, and a conductive core wire 63 is exposed. Note that the core wire 63 is formed from a copper metal or other metal for example, but may be formed from any type of material so long as the material is conductive and can be soldered. Furthermore, the wire may be a single wire formed from one wire, or may be a stranded wire where a plurality of thin wires are gathered.

A connection pad 53 is formed on an upper surface of the substrate 11. The connection pad 53 is a foil shaped thin plated member formed from a copper metal or other metal for example, but may be formed from any type of material so long as the material is conductive and can be soldered. Furthermore, the connection pad 53 provides a long and thin rectangular upper surface shape extending in a front and rear direction (left and right direction in FIGS. 1 to 3), and in an example illustrated in the drawing, is arranged such that a plurality (for example, four) form a row extending in a width direction (vertical direction in FIG. 1) of the substrate 11 arranged side by side. Furthermore, the connection pads 53 are electrically connected to a conductive trace or conductive wire provided by the substrate 11, which is not illustrated in the drawing. Note that the number of connection pads 53 may be one, may be five or more, or may be any number.

Furthermore, the core wire 63 of the electrical wires 62 is connected to an upper surface of the connection pads 53 through a solder 55. In other words, the core wire 63 is soldered to an upper surface of the connection pad 53. Thereby, the core wire 63 of the electrical wires 62 is in a condition electrically connected to the corresponding connection pad 53. Note that the core wire 63 of the electrical wire 62 is not necessarily required to be soldered to all connection pads 53, and the core wire 63 of all electrical wires 62 are not necessarily required to be soldered to the connected pad 53.

In the present embodiment, a pitch P of the electrical wire 62 of the cable 61 or the core wire 63 is narrow, and is approximately P=36 to 150 [μm] for example. Furthermore, a diameter D of the core wire 63 is also minimal. For example, if the pitch P is 36 [μm], the diameter is preferably approximately D=16 [μm], if the pitch P is 100 [μm], the diameter is preferably approximately D=40 to 60 [μm], in other words, approximately 50 [μm], and if the pitch P is 150 [μm], the diameter is preferably approximately D=75 to 105 [μm], in other words, approximately 90 [μm].

The connection pad 53 is arranged to correspond to the pitch P of the electrical wire 62 of the cable 61 or the core wire 63. In other words, the connection pad 53 is arranged such that the pitch is approximately P=36 to 150 [μm] for example. Furthermore, a width L of the connection pad 53 is preferably set to be a value that is equivalent to the diameter D of the core wire 63. In other words, for example, if the pitch P is 36 [μm], the width is preferably approximately L=15 to 25 [μm], in other words, approximately 20 [μm], if the pitch P is 100 [μm], the width is preferably approximately L=40 to 60 [μm], in other words, approximately 50 [μm], and if the pitch P is 150 [μm], the width is preferably approximately L=75 to 105 [μm], in other words, approximately 90 [μm].

As illustrated in FIG. 3, a total length Dt of the connection pad 53 is set to be longer than a length Ds of an overlapping portion of the connection pad 53 and core wire 63. Note that the overlapping portion is a portion where the connection pad 53 and core wire 63 are connected through the solder 55, and therefore is preferably a certain length or more in order to achieve sufficient connecting strength. For example, the length is preferably set to be 4 times or more the diameter D of the core wire 63, in other words, Ds≤4D.

Furthermore, in the overlapping portion, a gap is present between an upper surface of the connection pad 53 and lower end of the core wire 63, and the solder 55 enters the gap to connect the connection pad 53 and core wire 63. The dimension of the gap, in other words, a connection solder height Hp is preferably approximately Hp=2 to 8 [μm]. Note that a distance from an upper surface of the substrate 11 to an upper surface of the connection pad 53, in other words, a protrusion height (thickness) H of the connection pad 53 is set to be approximately H=2 to 18 [μm].

Furthermore, the connection pad 53 preferably extends further frontward than a front end 63f of the core wire 63. Furthermore, a portion further frontward than the front end 63f of the core wire 63 in the connection pad 53 functions as a solder storing part 53a. In other words, when the solder 55 is in a melted condition at a point in time before a step of soldering the core wire 63 onto the connection pad 53 is completed, the solder storing part 53a is a portion that stores extra solder that could not be stored between the connection pad 53 and core wire 63, in other words, excess solder 55a. On the other hand, if the solder 55 is insufficient between the connection pad 53 and core wire 63, a portion or all of the excess solder 55a in a melted condition stored in the solder storing part 53a is supplied between the connection pad 53 and core wire 63.

Thereby, a sufficient amount of the solder 55 is stably supplied between the connection pad 53 and core wire 63, and therefore, the core wire 63 is reliably soldered to the connection pad 53, and extra solder 55 does not leak out from between the connection pad 53 and core wire 63. Therefore, leaking solder 55 reaching an adjacent connection pad 53 causing adjacent connection pads 53 to short circuit due to the solder 55 will not occur, in other words, solder bridging will not occur. Therefore, even if the connection pad 53 is fine and arranged at a narrow pitch, the fine core wire 63 of the fine electrical wire 62 can be reliably connected by soldering.

As illustrated in FIG. 4, an upper surface of the solder storing part 53a is preferably covered by a thin layer of excess solder 55a across the entire body, but the entire body is not required to be covered by the excess solder 55a, and only a portion may be covered by the excess solder 55a.

A length Dpc of the solder storing part 53a is preferably a certain length or longer in order to sufficiently demonstrate a function of the solder storing part 53a of adjusting the amount of solder 55 supplied between the connection pad 53 and core wire 63. For example, the length is preferably set to be 2 times or more the diameter D of the core wire 63, in other words, Dpc≥2D. Therefore, the total length Dt of the connection pad 53 is preferably set to such that Dt≥6D.

Furthermore, as illustrated in FIG. 4, a front fillet 55b serving as a solder fillet is preferably formed in front of the core wire 63, and a rear fillet 55c serving as a solder fillet is preferably formed behind the connection pad 53. The front fillet 55b is a portion that extends frontward from the front end 63f of the core wire 63 and where the thickness of the solder 55 on an upper surface of the connection pad 53 gradually becomes thinner so as to have a concave shape in a side surface view. On the other hand, the rear fillet 55c is a portion that extends rearward from the rear end 53r of the connection pad 53 and where the thickness of the solder 55 on a lower surface of the core wire 63 gradually becomes thinner so as to have a concave shape in a side surface view.

When the front fillet 55b is formed, even if an external force is applied where the core wire 63 soldered to the connection pad 53 is displaced upward and pulled away from the connection pad 53, fissures (cracks) are less likely to occur on the solder 55 that is present between the front end 63f of the core wire 63 and upper surface of the connection pad 53, and therefore, the solder 55 is less likely to break, and the core wire 63 is less likely to pull away from the connection pad 53. Furthermore, when the rear fillet 55c is formed, even if an external force is applied where the core wire 63 soldered to the connection pad 53 is displaced upward and pulled away from the connection pad 53, fissures are less likely to occur on the solder 55 that is present between the rear end 53r of the connection pad 53 and lower surface of the core wire 63, and therefore, the solder 55 is less likely to break, and the core wire 53 is less likely to pull away from the connection pad 53.

Next, a case where a positional deviation occurs between the connection pad 53 and core wire 63 of the electrical wire 62 will be described.

Figure 5A:
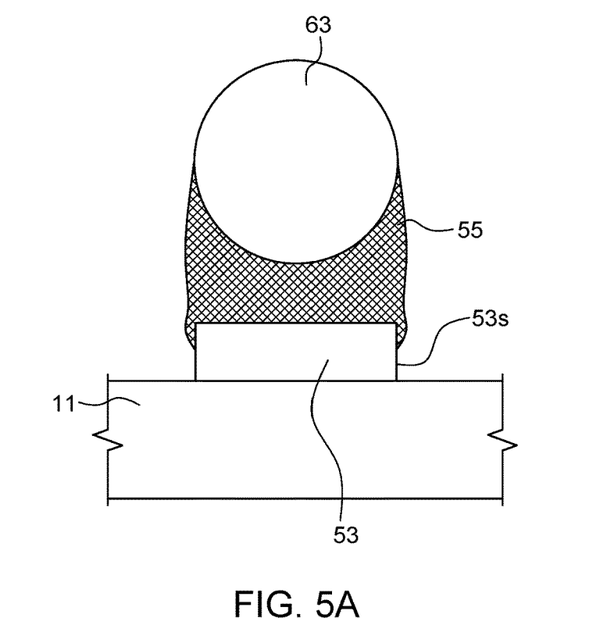
Figure 5B:
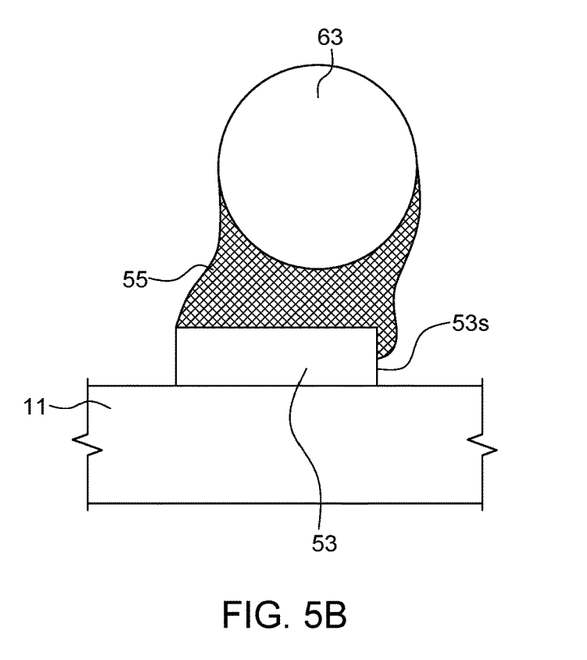

FIGS. 5A and 5B illustrate a main part enlarged front surface view of the conductor connecting structure according to the present embodiment. Note that in the drawing, FIG. 5A is a view illustrating a case where a positional deviation does not occur, and FIG. 5B is a view illustrating a case where a positional deviation occurs.

When connecting the cable 61 to the substrate 11, soldering is performed by heating in a condition where the cable 61 is set onto the substrate 11 such that the core wire 63 of the electrical wires 62 is positioned on a corresponding connection pad 53. At this time, in principle, the cable 61 is set onto the substrate 11 such that a center axis of the core wire 63 of the electrical wires 62 and a center axis of a corresponding connection pad 53 match in plan view. Thereby, after soldering is performed, an upper surface of the connection pad 53 and a lower surface of the core wire 63 are reliably connected by the solder 55 interposed therebetween as illustrated in FIG. 5A. Furthermore, in most cases, the solder 55 is also adhered to at least one side end 53s of the connection pad 53. Note that extra solder 55 is stored in the solder storing part 53a, and therefore, the solder 55 does not protrude from between the connection pad 53 and core wire 63.

However, during an operation of setting the cable 61 onto the substrate 11 or the like, a condition where a center axis of the core wire 63 of the electrical wires 62 and a center axis of a corresponding connection pad 53 do not completely match may occur, in other words, a positional deviation between the core wire 63 and connection pad 53 may occur. Thereupon, after soldering is performed, the core wire 63 is in a condition positionally deviated in a width direction (left and right direction in the example illustrated in the drawing) with regard to the connection pad 53, as illustrated in FIG. 5B.

As described above, when the width L of the connection pad 53 is set to a value equivalent to the diameter D of the core wire 63, the core wire 63 is in a condition protruding in a width direction from the connection pad 53. Even in this case, a sufficient amount of the solder 55 is supplied between the connection pad 53 and core wire 63 from the solder storing part 53a, and therefore, as illustrated in FIG. 5B, the solder 55 is adhered to a side end 53s of the connection pad 53 on a side where the core wire 63 protrudes. Therefore, a lower surface of the core wire 63 on a side protruding from the connection pad 53 is also in a condition connected to the connection pad 53, and thus the connection pad 53 and core wire 63 are reliable connected.

However, during an operation of setting the cable 61 onto the substrate 11 or the like, a gap between an upper surface of the connection pad 53 and lower end of the core wire 63 may be compressed. Thereupon, the solder 55 is discharged in a width direction from between the connection pad 53 and core wire 63, and when the pitch P is very narrow such as 36 to 150 [μm], the solder reaches an adjacent connection pad 53, and thus there is a possibility that so-called solder bridging may occur, where adjacent connection pads 53 short circuit due to the solder 55.

Therefore, means for reliably preventing a solder bridge from occurring will be described.

Figure 6A:
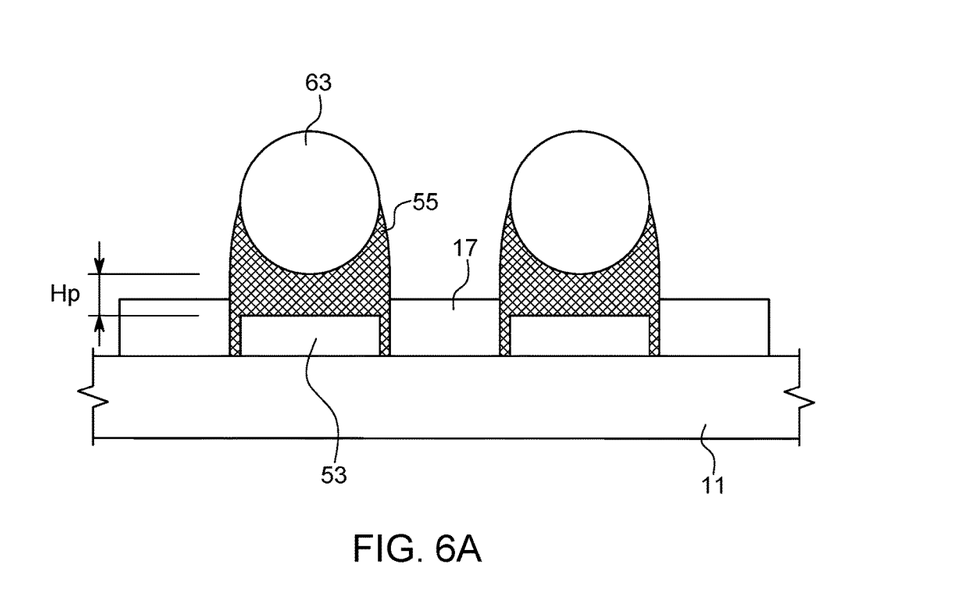
Figure 6B:
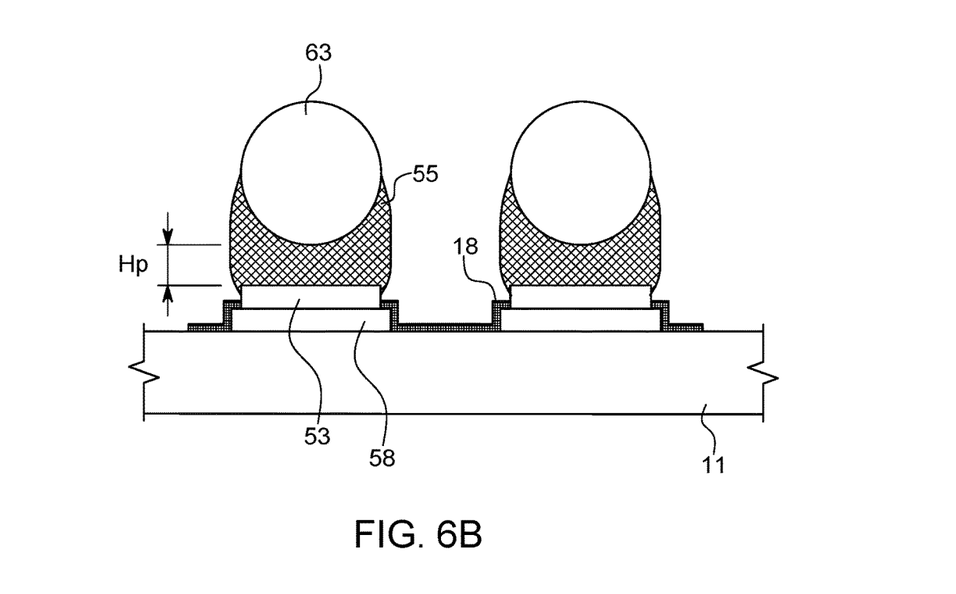

FIGS. 6A and 6B illustrates a main part enlarged front surface view of the conductor connecting structure according to the present embodiment of forming means for preventing a solder bridge from occurring. Note that in the drawing, FIG. 6A is a view illustrating a case where the solder resist is used, and FIG. 6B is a view illustrating a case where the insulation protective film is used.

FIG. 6A illustrates an example of using a solder resist 17 as means of preventing a solder bridge from occurring. The solder resist 17 is a film formed from thermosetting epoxy resin, and is formed near the connection pad 53 on an upper surface of the substrate 11, and particularly between adjacent connection pads 53. Adhering of the solder 55 is prevented by the solder resist 17, and therefore, a solder bridge that connects adjacent connection pads 53 is reliably prevented from occurring, and a short circuit between adjacent connection pads 53 or core wires 63 is reliably prevented. A connection solder height Hp when using the solder resist 17 is preferably approximately Hp=2 to 40 [μm].

Furthermore, FIG. 6B illustrates an example of using a nitride film 18 which is an insulation protective film as means of preventing a solder bridge from occurring, if the substrate 11 itself is an integrated circuit board. In this case, the substrate 11 is a silicone substrate, where surface wiring 58 formed from a metal such as aluminum or the like is formed on a surface of the substrate 11, and the connection pad 53 is formed on the surface wiring 58. Furthermore, the nitride film 18 is a silicone nitride film, and is formed near the connection pad 53 on an upper surface of the substrate 11, and particularly between adjacent connection pads 53. Note that the nitride film 18 is also formed on the surface wiring 58, excluding the connection pad 53. Adhering of the solder 55 is prevented by the nitride film 18, and therefore, a solder bridge that connects adjacent connection pads 53 is reliably prevented from occurring, and a short circuit between adjacent connection pads 53, core wires 58, or surface wiring 58 is reliably prevented. A connection solder height Hp when using the insulation protective film is preferably approximately Hp=2 to 8 [μm].

Note that FIGS. 1 to 4 only illustrates an example where a row of the connection pads 53 extending in a width direction of the substrate 11 is arranged to form only one row, but a plurality of rows of the connection pads 53 extending in a width direction of the substrate 11 may be formed.

Figure 7:
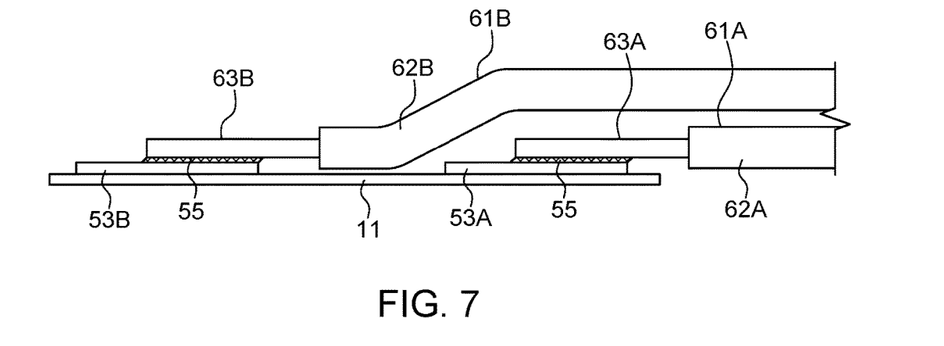
FIG. 7 is a side surface view of a conductor connecting structure according to the present embodiment where a plurality of rows of the connection pads are formed.

FIG. 7 is a side surface view of a conductor connecting structure according to the present embodiment where a plurality of rows of the connection pads are formed.

In the example illustrated in the drawing, the number of rows of connection pads 53 is two which includes a first row and second row for convenience of illustration, but may be three rows or any number of rows. Furthermore, the rows of the connection pads 53 may be arranged in a zigzag manner or in a cascading manner. Furthermore, a conductor circuit of the substrate 11 may be disposed in a radial or crank shape, and may have a via (through hole). Herein, 53A represents a first connection pad forming a first row extending in a width direction of the substrate near a rear end (right end in the drawing) of the substrate 11, and 53B represents a second connection pad forming a second row extending in a width direction of the substrate 11 further frontward (left in the drawing) than the first row.

First core wires 63A of first electrical wires 62A provided by a first cable 61A are connected to the first connection pads 53A through the solder 55. Furthermore, second core wires 63B of second electrical wires 62B provided by a second cable 61B are connected to the second connection pads 53B through the solder 55. Furthermore, the second cable 61B is arranged to be positioned above the first cable 61A. Configurations of other points are similar to the examples illustrated in FIGS. 1 to 4, and therefore, a description thereof is omitted.

Therefore, in the present embodiment, the conductor connecting structure 1 connects the cable 61 to the substrate 11. Furthermore, the substrate 11 includes at least one connection pad 53, the cable 61 includes at least one electrical wire 62 having the core wire 63, the core wire 63 is connected to an upper surface of the connection pad 53 through the solder 55, and the connection pad 53 includes the solder storing part 53a that is present further frontward than the front end 63f of the core wire 63.

Thereby, a sufficient amount of the solder 55 is stably supplied between the connection pad 53 and core wire 63, and therefore, the core wire 63 is reliably soldered to the connection pad 53. Therefore, even with a fine connection pad 53, a cable 61 including a fine electrical wire 62 can be reliably connected by soldering.

Furthermore, the solder storing part 53a is present across a range two or more times a diameter of the core 63. Thereby, a sufficient amount of the solder 55 can be stored in the solder storing part 53a, and the amount of the solder 55 supplied between the connection pad 53 and core wire 63 can be appropriately and quickly adjusted.

Furthermore, the front fillet 55b is formed in front of the core wire 63. Therefore, even if an external force is applied where the core wire 63 soldered to the connection pad 53 is displaced upward and pulled away from the connection pad 53, fissures are less likely to occur on the solder 55 that is present between the front end 63f of the core wire 63 and upper surface of the connection pad 53, and therefore, the solder 55 is less likely to break, and the core wire 63 is less likely to pull away from the connection pad 53.

Furthermore, a plurality of the connection pads 53 are arranged side by side, and a coating film of a solder resist 17 or the nitride film 18 is formed between the connection pads 53 adjacent on an upper surface of the substrate 11. Thereby, a solder bridge that connects adjacent connection pads 53 is reliably prevented from occurring, and a short circuit between adjacent connection pads 53 or core wires 63 is reliably prevented.

Furthermore, the connection pad 53 has side ends 53s exposed further upward than an upper surface of the substrate 11 on both left and right sides, and the solder 55 adheres to at least one side end 53s. Thereby, even in a condition where a positional deviation occurs between the connection pad 53 and core wire 63 of the electrical wire 62, and the core sire 63 protrudes in a width direction from the connection pad 53, the solder 55 adheres to the side end 53s of the connection pad 53 on a side where the core wire 63 protrudes, and therefore, a connection between the connection pad 53 and core wire 63 is reliably maintained.

Furthermore, the rear fillet 55c is formed behind the connection pad 53. Therefore, even if an external force is applied where the core wire 63 soldered to the connection pad 53 is displaced upward and pulled away from the connection pad 53, fissures are less likely to occur on the solder 55 that is present between the rear end 53*r* of the connection pad 53 and lower surface of the core wire 63, and therefore, the solder 55 is less likely to break, and the core wire 53 is less likely to pull away from the connection pad 53.

Note that the disclosure of the present specification describes characteristics related to preferred and exemplary embodiments. Various other embodiments, modifications and variations within the scope and spirit of the claims appended hereto could naturally be conceived of by persons skilled in the art by summarizing the disclosures of the present specification.

The present disclosure can be applied to a conductor connecting structure.

The invention claimed is:

1. A conductor connecting structure comprising:
a substrate having at least one connection pad, the at least one connection pad having an upper surface and a solder storing part, the at least one connection pad having a width; and
a cable having at least one core wire, the at least one core wire having a front end, the at least one core wire being connected to the upper surface of the connection pad via soldering such that the solder storing part of the at least one connection pad is further frontward than the front end of the at least one core wire, the at least one core wire having a diameter, wherein the diameter of the at least one core wire is substantially equal to the width of the at least one connection pad.

2. The conductor connecting structure as defined in claim 1, wherein the diameter of the at least one core wire is approximately 16 μm to 105 μm.

3. The conductor connecting structure as defined in claim 2, wherein the cable has at least two core wires, wherein a pitch of adjacent core wires is approximately 36 μm to 150 μm.

4. The conductor connecting structure as defined in claim 3, wherein the diameter of the at least two core wires is approximately 16 μm and the pitch of adjacent core wires is approximately 36 μm.

5. The conductor connecting structure as defined in claim 3, wherein the diameter of the at least two core wires is approximately 40 μm to 60 μm and the pitch of adjacent core wires is approximately 100 μm.

6. The conductor connecting structure as defined in claim 3, wherein the diameter of the at least two core wires is approximately 75 μm to 105 μm and the pitch of adjacent core wires is approximately 150 μm.

7. The conductor connecting structure as defined in claim 1, wherein the width of the at least one connection pad is approximately 15 μm to 105 μm.

8. The conductor connecting structure as defined in claim 7, wherein the substrate has at least two connection pads, wherein a pitch of adjacent connection pads is approximately 36 μm to 150 μm.

9. The conductor connecting structure as defined in claim 8, wherein the width of the at least two connection pads is approximately 15 μm to 25 μm and the pitch of adjacent connection pads is approximately 36 μm.

10. The conductor connecting structure as defined in claim 8, wherein the width of the at least two connection pads is approximately 40 μm to 60 μm and the pitch of adjacent connection pads is approximately 100 μm.

11. The conductor connecting structure as defined in claim 8, wherein the width of the at least two connection pads is approximately 75 μm to 105 μm and the pitch of adjacent connection pads is approximately 150 μm.

12. The conductor connecting structure as defined in claim 1, wherein the at least one connection pad has a total length, wherein the total length of the at least one connection pad is greater than or equal to six times the diameter of the at least one core wire.

13. The conductor connecting structure as defined in claim 12, wherein the solder storing part has a length which is less than the total length of the at least one connection pad, wherein the length of the solder storing part is greater than or equal to two times the diameter of the at least one core wire.

14. The conductor connecting structure as defined in claim 1, wherein the at least one connection pad has a total length, and wherein the width of the at least one connecting pad is constant throughout the total length thereof.

15. The conductor connecting structure as defined in claim 1, wherein a solder fillet is formed in front of the at least one core wire.

16. The conductor connecting structure as defined in claim 1, wherein the substrate has a plurality of connecting pads arranged side by side, and wherein a coating film of a solder resist is formed between adjacent connecting pads on an upper surface of the substrate.

17. The conductor connecting structure as defined in claim 1, wherein the substrate has a plurality of connecting pads arranged side by side, and wherein a coating film of an insulation protective film is formed between adjacent connecting pads on an upper surface of the substrate.

18. The conductor connecting structure as defined in claim 1, wherein the at least one connection pad has right and left side ends exposed further upward than an upper surface of the substrate, wherein the solder adheres to at least one of the right and left side ends.

19. The conductor connecting structure as defined in claim 1, wherein a solder fillet is formed behind the at least one connection pad.

20. The conductor connecting structure as defined in claim 1, wherein the substrate is a printed circuit board, a flexible circuit board, or an integrated circuit board.

* * * * *